US010755984B2

(12) United States Patent
Glass et al.

(10) Patent No.: US 10,755,984 B2
(45) Date of Patent: Aug. 25, 2020

(54) REPLACEMENT CHANNEL ETCH FOR HIGH QUALITY INTERFACE

(71) Applicant: INTEL CORPORATION, Santa Clara, CA (US)

(72) Inventors: Glenn A. Glass, Portland, OR (US); Ying Pang, Portland, OR (US); Nabil G. Mistkawi, Keizer, OR (US); Anand S. Murthy, Portland, OR (US); Tahir Ghani, Portland, OR (US); Huang-Lin Chao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/576,396

(22) PCT Filed: Jun. 24, 2015

(86) PCT No.: PCT/US2015/037344
§ 371 (c)(1),
(2) Date: Nov. 22, 2017

(87) PCT Pub. No.: WO2016/209220
PCT Pub. Date: Dec. 29, 2016

(65) Prior Publication Data
US 2018/0197789 A1 Jul. 12, 2018

(51) Int. Cl.
*H01L 21/8238* (2006.01)
*H01L 21/02* (2006.01)
(Continued)

(52) U.S. Cl.
CPC ......... *H01L 21/823807* (2013.01); *H01L 21/02532* (2013.01); *H01L 21/02546* (2013.01);
(Continued)

(58) Field of Classification Search
CPC ............ H01L 29/785; H01L 21/02532; H01L 21/823821; H01L 29/7849
See application file for complete search history.

(56) References Cited

U.S. PATENT DOCUMENTS 8,633,516 B1 1/2014 Wu et al.
2005/0148147 A1 7/2005 Keating et al.
(Continued)

FOREIGN PATENT DOCUMENTS

WO 2016105412 A1 6/2016
WO 2016200402 A1 12/2016
WO 2016209220 A1 12/2016

OTHER PUBLICATIONS

International Search Report and Written Opinion received for PCT/US2015/037344, dated Mar. 31, 2016, 14 pages.
(Continued)

Primary Examiner — Changhyun Yi
(74) Attorney, Agent, or Firm — Finch & Maloney PLLC

(57) ABSTRACT

Techniques are disclosed for customization of fin-based transistor devices to provide a diverse range of channel configurations and/or material systems, and within the same integrated circuit die. Sacrificial fins are removed via wet and/or dry etch chemistries configured to provide trench bottoms that are non-faceted and have no or otherwise low-ion damage. The trench is then filled with desired semiconductor material. A trench bottom having low-ion damage and non-faceted morphology encourages a defect-free or low defect interface between the substrate and the replacement material. In an embodiment, each of a first set of the sacrificial silicon fins is recessed and replaced with a p-type material, and each of a second set of the sacrificial fins is recessed and replaced with an n-type material. Another embodiment may include a combination of native
(Continued)

fins (e.g., Si) and replacement fins (e.g., SiGe). Another embodiment may include replacement fins all of the same configuration.

11 Claims, 10 Drawing Sheets

(51) Int. Cl.
    *H01L 21/8234* (2006.01)
    *H01L 27/092* (2006.01)
    *H01L 29/06* (2006.01)
    *H01L 29/08* (2006.01)
    *H01L 29/10* (2006.01)
    *H01L 29/161* (2006.01)
    *H01L 29/20* (2006.01)
    *H01L 29/66* (2006.01)

(52) U.S. Cl.
    CPC ........... *H01L 21/823481* (2013.01); *H01L 21/823814* (2013.01); *H01L 21/823821* (2013.01); *H01L 27/0924* (2013.01); *H01L 29/0653* (2013.01); *H01L 29/0847* (2013.01); *H01L 29/1054* (2013.01); *H01L 29/161* (2013.01); *H01L 29/20* (2013.01); *H01L 29/6681* (2013.01)

(56) References Cited

U.S. PATENT DOCUMENTS

| | | | |
|---|---|---|---|
| 2010/0012976 A1* | 1/2010 | Hydrick | ............ H01L 21/02057 257/190 |
| 2010/0048027 A1 | 2/2010 | Cheng et al. | |
| 2011/0097881 A1 | 4/2011 | Vandervorst et al. | |
| 2011/0147839 A1 | 6/2011 | Yagishita et al. | |
| 2013/0017660 A1 | 1/2013 | Fang et al. | |
| 2014/0027860 A1* | 1/2014 | Glass | ............... H01L 21/823807 257/401 |
| 2014/0197456 A1 | 7/2014 | Wang et al. | |
| 2014/0220753 A1 | 8/2014 | Lee et al. | |
| 2014/0239396 A1 | 8/2014 | Liu et al. | |
| 2015/0123144 A1 | 5/2015 | Wu et al. | |
| 2016/0359044 A1* | 12/2016 | Bedell | ................. H01L 29/7842 |

OTHER PUBLICATIONS

International Preliminary Report on Patentability received for PCT/US2015/037344, dated Jan. 4, 2018. 11 pages.
Extended European Search Report received for EP Application No. 15896513.7, dated Jan. 10, 2019. 10 pages.

* cited by examiner

REPLACEMENT CHANNEL ETCH FOR HIGH QUALITY INTERFACE

BACKGROUND

Maintaining mobility improvement and short channel control as microelectronic device dimensions continue to scale provides a challenge in device fabrication. In particular, during design and manufacture of metal-oxide-semiconductor (MOS) transistor semiconductor devices, such as those used in complementary metal-oxide-semiconductor (CMOS) devices, it is often desired to increase movement of electrons (carriers) in n-type MOS device (NMOS) channels and to increase movement of holes (carriers) in p-type MOS device (PMOS) channels. Fin-based transistor devices can be used to provide improved short channel control. Typical CMOS transistor devices utilize silicon as the channel material for both hole and electron majority carrier MOS channels. Switching to other channel materials can improve mobility. For example, silicon germanium ($Si_xGe_{1-x}$, where x<0.2) fin-based channel structures provide mobility enhancement, which is suitable for use in many applications.

BRIEF DESCRIPTION OF THE DRAWINGS

FIGS. 2g' and 2h' illustrate an alternate embodiment where the wafer is further processed to provide a second set of replacement fins by repeating the masking, etching, deposition, and planarization respectively shown in FIGS. 2c-2f for a second set of fins, in accordance with an embodiment of the present disclosure.

Figure 1:
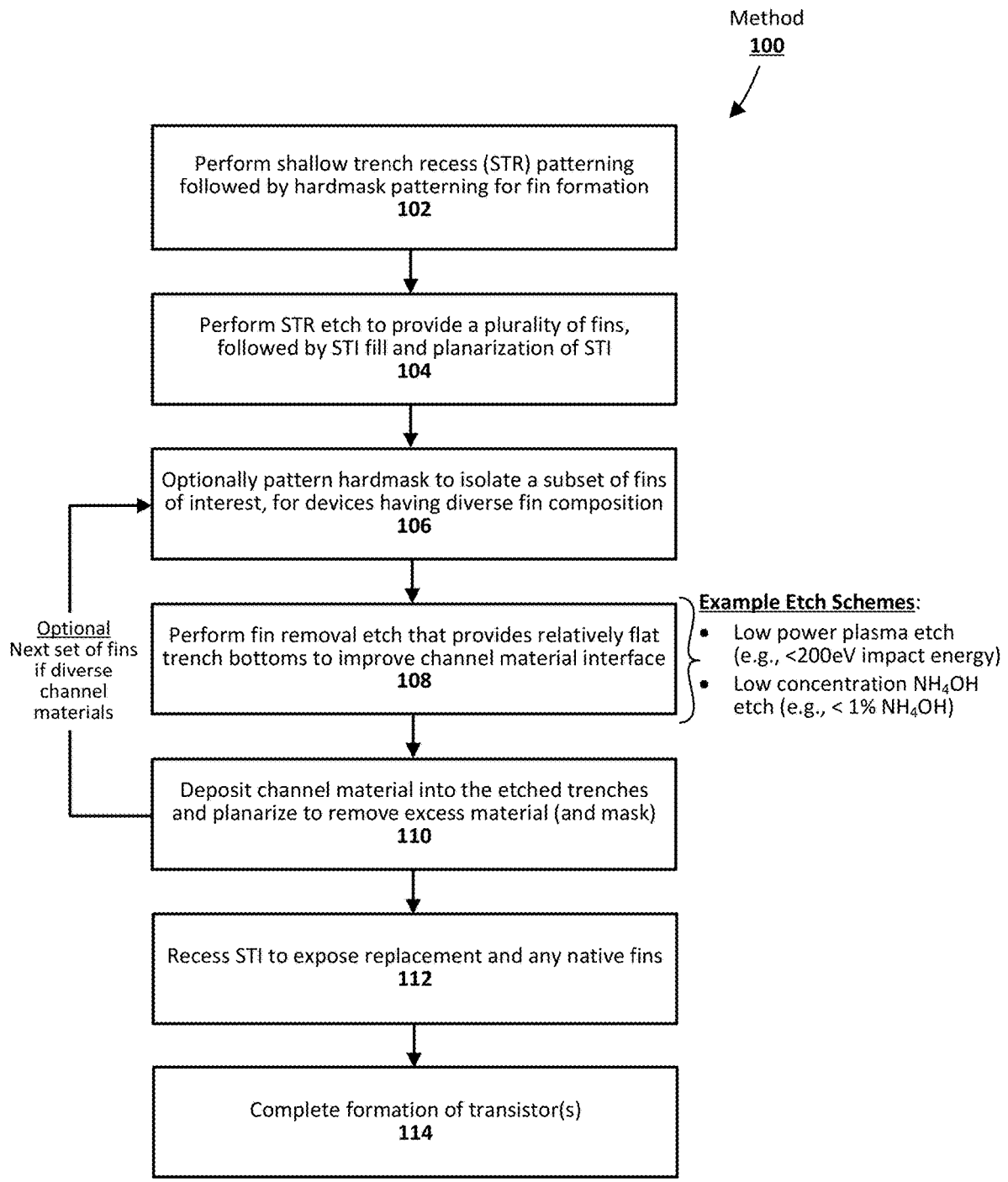
FIG. 1 illustrates a method for forming non-planar transistor devices by way of a shallow trench recess process that avoids trench bottom characteristics detrimental to transistor performance, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. To this end, the X-SEM image figures have been provided in conjunction with man-made figures to demonstrate examples of actual real world shapes and features, including trench bottoms having low-ion damage and non-faceted morphology according to an embodiment as well as trench bottoms having ion damaged irregular morphology and faceted morphology.

DETAILED DESCRIPTION

Techniques are disclosed for customization of fin-based transistor devices to provide a diverse range of channel configurations and/or material systems, and within the same integrated circuit die. In accordance with an embodiment, sacrificial fins are removed to provide narrow trenches in which fin replacement material can be deposited. The trench etch is configured to provide trench bottoms that are non-faceted and have no or otherwise low-ion damage. A replacement semiconductor material of arbitrary composition and strain suitable for a given application is then deposited into the trenches. As will be appreciated in light of this disclosure, a trench bottom having low-ion damage and non-faceted morphology encourages a defect-free or otherwise relatively low-defect interface between the substrate and the replacement material, as compared to trench bottoms having faceted or ion damage morphology resulting from typical etch chemistries. The trench etch is implemented with at least one of wet and dry etch chemistries configured to create the non-faceted, low-ion damage trench bottom. The techniques can be used to form PMOS and NMOS transistor devices, as well as with any number of material systems, such as column IV and III-V materials. In one specific embodiment, the substrate is a bulk silicon substrate and the substitute fin material is silicon germanium (SiGe) to provide PMOS channels. In another embodiment, each of a first set of the sacrificial silicon fins is recessed and replaced with a p-type material, and each of a second set of the sacrificial fins is recessed and replaced with an n-type material. The p-type material can be completely independent of the process for the n-type material, and vice-versa. Another embodiment may include a combination of original or so-called native fins and replacement fins. Another embodiment may include replacement fins all of the same configuration. Numerous other configurations and variations are enabled using the techniques provided herein.

General Overview

Typical CMOS transistor devices utilize silicon as the channel material for both hole and electron majority carrier MOS channels. However, co-integration of diverse channel materials on a given substrate can be helpful in various applications, depending on factors such as desired polarities and carrier mobility. For example, III-V materials for NMOS channels and Ge/SiGe materials for PMOS channels is one example that can be used as a replacement scheme for native silicon CMOS channels. The hole mobility in a SiGe FinFET can be increased by introducing compressive stress thru growing the SiGe channel epitaxially on top of silicon in shallow trench isolation (STI) structures prepared on (001) silicon wafers. In more detail, STI structures are made by patterning fins, filling the recess with insulating material, and then etching out the native silicon fins so as to provide trenches. The SiGe replacement fins are then grown in the trenches. There are a number of non-trivial problems that arise with typical recess etch processing. For instance, purely chemical etches can generate sharp <111> facets on the trench bottom of the silicon substrate. Such a faceted trench bottom is not ideal for SiGe growth due to slow or inhibited nucleation on faceted surfaces. On the other hand, purely physical etches can lead to significant amorphization and crystalline damage at the trench bottom, which in turn leads to poor film quality or lack of epitaxial film growth.

Thus, and in accordance with an embodiment of the present disclosure, a trench etch methodology is provided for forming trench bottoms having relatively low or no ion damage and non-faceted morphology, relative to conventional trench etch methods. The methodology is particularly well-suited for customization of fin-based transistor devices to provide a diverse range of channel configurations and/or material systems, and within the same integrated circuit die. In accordance with an embodiment, sacrificial fins are removed to provide relatively narrow trenches in which fin replacement material can be deposited. The trench forming methodology used in removing the sacrificial fins provides trench bottoms that are non-faceted and have no or otherwise low-ion damage. A replacement semiconductor material of arbitrary composition and strain suitable for a given application is then deposited into the trenches. The trench bottoms having low-ion damage and non-faceted morphology encourages a defect-free or otherwise relatively low-defect interface between the substrate and the replacement material, relative to trench bottoms having ion damage or faceted morphology. Standard transistor forming processes can then be carried out to form the gate stack and source/drain regions and contacts. Numerous applications will be appreciated in light of this disclosure.

In accordance with some embodiments, the trench etch can be implemented with anisotropic wet and/or dry etch chemistries configured to create the non-faceted, low-ion damage trench bottom. Examples of non-faceting and low-ion damage inducing wet etches include low concentration ammonium hydroxide ($NH_4OH$), such as etches having a concentration of $NH_4OH$ of 1% or less. In the dry etch space, low energy plasma can be used to provide the desired low-ion damage and non-faceted morphology. Examples of non-faceting and low-ion damage inducing dry etches include low power plasma etches using argon hydrogen ($Ar/H_2$), argon chlorine ($Ar/Cl_2$), nitrogen fluoride ($NF_3$), nitrogen fluorine chlorine ($NF_3Cl_2$), ammonia/ammonia hydroxide ($NF_3/NH_4$), sulfur flourine ($SF_6$), or hydrogen bromide (HBr) with 1 kW or less, such as 200 eV or less or 20 eV or less. As will be appreciated in light of this disclosure, such wet and/or dry etches can effectively be used to etch silicon isotropically without regard to crystallographic plane while suppressing faceting in the <111> plane that often occurs in chemical etches. The resulting low-ion damage, morphologically flat or curved or otherwise non-faceted low-ion damage trench silicon trench bottom is ideal, for example, for SiGe growth. While such non-faceting low-ion damage etches are relatively slow, the resulting trench bottom has a morphology that encourages good material interfaces. In some embodiments, a faster etch process can be used to remove a bulk of the sacrificial material and a morphology-tuning etch can then be employed to finish the trench to provide the desired trench bottom qualities. Note that for non-faceted trench bottoms that are curved, the curved trench bottom is generally flatter than a semi-circle cross-section in some such embodiments. Any trench bottom curvature sharper than a semi-circle may inhibit epitaxial growth. Likewise, if the trench bottom crystalline structure is too damaged then the quality of the epitaxial growth on that trench bottom will be inhibited or otherwise diminished. To this end, the epitaxial growth process may not proceed with device quality layers.

Device quality can be based on, for example, a defect count obtained by summing up dislocations and stacking faults at the interface and in the epitaxial layer, with defect counts greater than 10000 per linear centimeter (cm) of fin length being unacceptable for device grade applications, in accordance with an embodiment of the present disclosure. Typical defect count densities of standard dry or wet etches in this context are above 10000 per linear cm of fin length. In contrast, dislocation and stacking fault counts below 1000 per linear cm, or below 500 per linear cm, or below 100 per linear cm, or below 50 per linear cm, and as low as zero defects per linear cm, may result at the trench bottom interface when using etch techniques provided herein, in accordance with some embodiments. To this end, "low-ion damage" as used herein can be quantified in terms such as defect count per linear cm of fin length (or other area of interest), such that the combined count of dislocation and stacking faults at the trench bottom interface between the replacement material and the underlying substrate is below 10000 per linear cm, and in some embodiments below 5000 per linear cm, or below 1000 per linear cm, or below 500 per linear cm, or below 100 per linear cm, or below 50 per linear cm, and as low as zero defects per linear cm. As will be appreciated, such a defect count can readily be extrapolated to areas smaller than a linear centimeter. For instance, in some embodiments, the defect count at a 10 nanometer (nm) length is below interface 0.001 defects per linear nm (extrapolated from 10000 defects per linear centimeter), or below 0.0001 defects per linear nm (extrapolated from 1000 defects per linear centimeter), or below 0.00001 defects per linear nm (extrapolated from 100 defects per linear centimeter), or below 0.000001 defects per linear nm (extrapolated from 10 defects per linear centimeter), and so on, down to zero defects per linear nm. In a more general sense, a trench bottom interface configured in accordance with an embodiment of the present disclosure has less than 10K defects/linear cm, or less than 1K defects/linear cm, or less than 500 defects/linear cm, or less than 100 defects/linear cm, or less than 50 defects/linear cm. Thus, in one specific example case, the trench-based interface between a silicon substrate and a SiGe replacement fin has less than 10K defects/linear cm, or less than 1K defects/linear cm, or less than 500 defects/linear cm, or less than 100 defects/linear cm, or less than 50 defects/linear cm.

Figure 4:
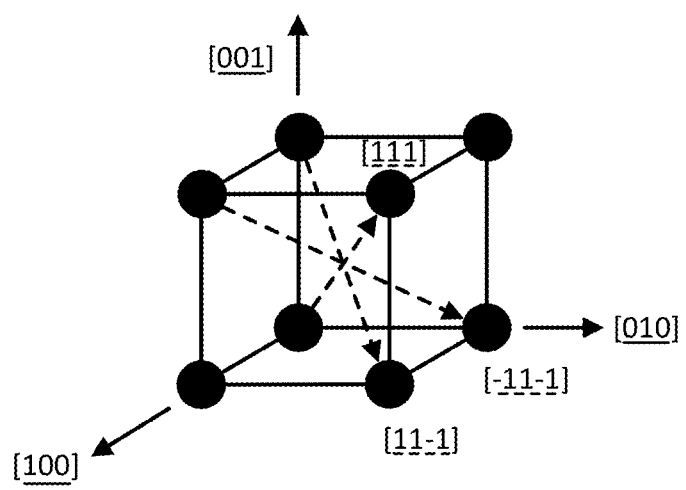
FIG. 4 illustrates a crystalline structure showing the Miller index direction naming convention.
Figure 5A:
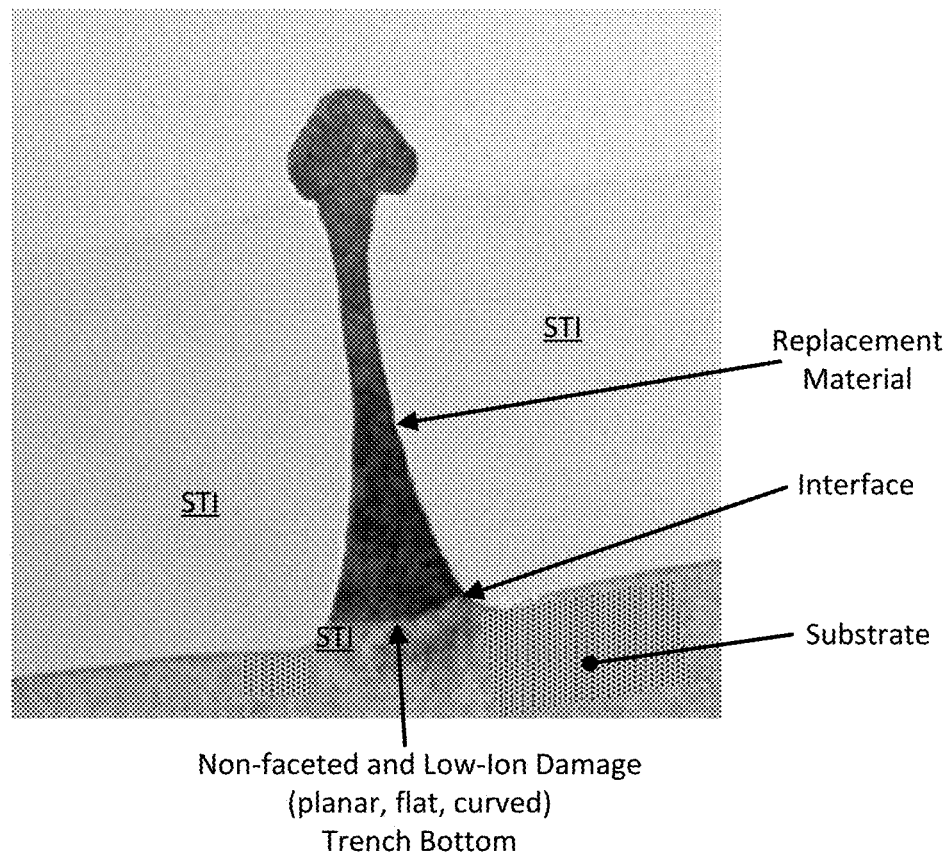
FIGS. 5a-5b each illustrates an X-SEM image of replacement fins formed in a recess etched by a process configured to provide a facet-free, low-ion damaged trench bottoms, in accordance with an embodiment of the present disclosure.
Figure 5B:
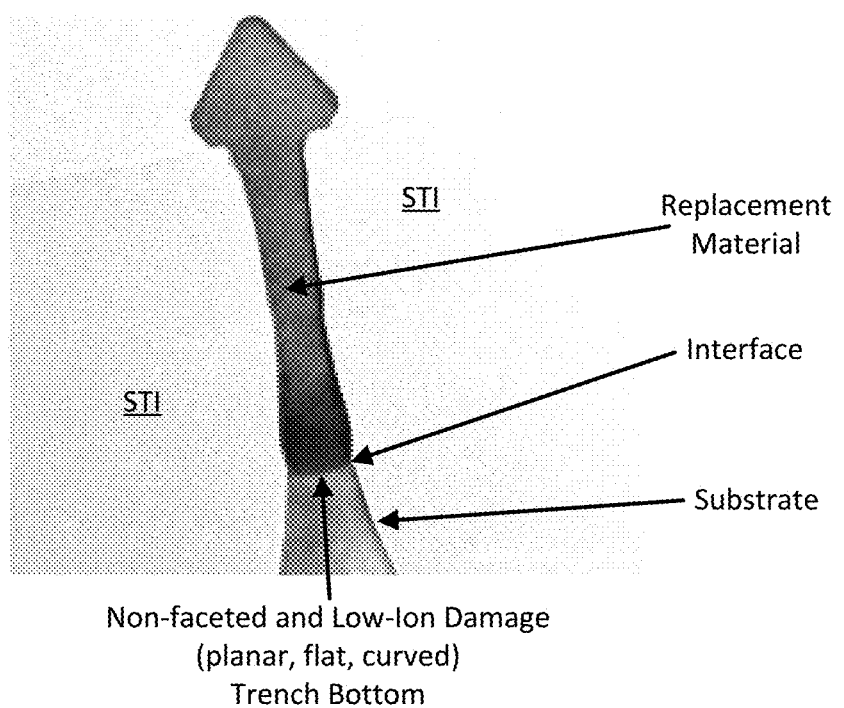

In effort to further explain how typical etches operate, reference is made to FIG. 4, which illustrates a crystalline structure showing the Miller index direction naming convention. Of relevance to this application is the angle of the <111> facet direction with respect to the horizontal direction <001>. Etch profile shapes can be ascribed descriptions of isotropic and anisotropic. With regard to commonly used dry etches, anisotropic refers to a directional etch. With standard ion energies (e.g., much greater than 3 kW or 20 eV), the directionality is generally determined by placement of the ion source and accelerating fields. Such dry etches are generally agnostic as to the crystalline structure of silicon such that they remove material primarily from the top of a given structure while removing successive layers of atoms without regard to crystal orientation. The opposite end of the spectrum would be isotropic dry etches. In this mode, the dry etch would have an etch rate that includes a lateral component in addition to a vertical one. In the context of wet etches, there is no single source of ions nor is there an electric field to accelerate them. In this case, the mode of anisotropy is with respect to crystal orientation. Wet etches such as standard $NH_4OH$ (much greater than 5% concentration of ammonia) have a generally fast etch rate on the plane of the silicon wafer (001 facet), but a relatively slower etch rate (more than 10× slower) on certain diagonal planes such as <111>, for example. There exists a special case of purely chemical dry etches with very low or even zero plasma power such as $Cl_2$, HCl, $ClF_3$ and these behave much like the anisotropic wet etches above. An isotropic wet etch refers to an etch that proceeds in all directions at the same rate without regard to crystal orientation. In contrast to the etch schemes provided herein, traditional etch schemes such as 10% to 50% ammonium hydroxide or a weak $Cl_2$ plasma result in sharp <111> faceting, which lead to a faceted trench bottom. Likewise, employing high ion energy reactive ion etches such as 10 kW $Ar/H_2$ result in ion damage, which causes crystalline damage at the trench bottom. Typical plasma etches are well over 2000 kW. Such typical wet and dry etching process spaces will result in poor epitaxial film quality as judged by dislocation and stacking fault densities and hence degraded transistor performance. Note that the resulting transistors will still operate, but will have a different trench bottom morphology and lower carrier mobility, relative to transistors formed in accordance with an embodiment of the present disclosure.

The techniques provided herein are particularly useful in the context of replacement channel processing. The following sequence illustrates an example process flow and location where the etches of interest may be employed, in accordance with an embodiment. Sacrificial fins are formed by way of shallow trench recess (STR) processing. After the trenches are filled with a suitable insulator material and planarized, the silicon fins portions (sacrificial place holders) are etched back to remove those portions. It is this particular etch that can be configured to avoid or otherwise reduce faceting and ion damage, particularly for the portion of the etch that forms the trench bottom. Once the silicon or other native placeholder material is removed or otherwise recessed, it can be replaced with epitaxial growth of, for example, a SiGe alloy of arbitrary composition, germanium, germanium-tin alloy of arbitrary composition, or a III-V material of arbitrary composition. For long and narrow lines, films are capable of growing epitaxially and with much lower crystalline defect densities than possible with large area planar growth. Epitaxial film growth proceeds to fill the recess and slightly higher. Post film growth polish processing can trim the film flat with the surrounding trench insulator material. Lithographic masking can be used to independently define p-MOS and n-MOS regions such that any set of materials can be used in combination.

As will be appreciated in light of this disclosure, the quality of the epitaxial material grown in the recess depends on the geometry of the recess as well as the lattice mismatch and surface energies of the two materials. For instance, while replacement fin materials such silicon, SiGe, germanium, and germanium tin (GeSn) may perform best with a non-faceted low-ion damage trench bottom, III-V materials tend to prefer another trench bottom shape. To this end, the trench recess etch process can be different among the various replacement fin trenches provisioned, depending on the replacement material to be deposited into those various trenches. For example, one embodiment provides a combination of SiGe replacement fins within trenches having non-faceted low-ion damage trench bottoms as variously described herein, and III-V material replacement fins within trenches having a faceted or otherwise different trench bottom morphology. Thus, note that a faster etch process may be used to provision the III-V material replacement material trenches, as will be further appreciated.

In some embodiments, the recess and replacement techniques provided herein can be used, for example, to fabricate fin-based transistors such as field effect transistors (FinFETs), and are particularly well-suited for forming tri-gate transistor architecture where the diffusion lines can be much narrower than the equivalent process node for planar transistors. In some embodiments, for example, a diffusion width of less than 30 nm, or less than 20 nm, or less than 10 nm is provided. To this end, the trench width can be as narrow as 30 nm, or 20 nm, or 10 nm, or less. In addition, in some embodiments, note that epitaxial films used for replacement fin (channel) materials such as SiGe alloys (or other suitable semiconductor materials) may be defect free as-deposited in these relatively narrow structures. In this case, the shape of the deposition has no trapping effect on crystalline defects because the films are intentionally free of such defects as dislocations and grain boundaries.

The techniques provided herein can be applied to PMOS and NMOS transistor devices, as well as any number of material systems, such as silicon and silicon germanium (SiGe) and III-V materials. In one specific embodiment, the substrate is a bulk silicon substrate and the substitute fin material is SiGe to provide PMOS channels. In such an embodiment, note that non-faceted Si/SiGe interface and high quality epi SiGe film in channel trenches can be seen in X-SEM, TEM or atom probe tomography; other embodiments are similarly detectable. In another embodiment, each of a first set of the sacrificial silicon fins is recessed and replaced with a p-type material, and each of a second set of the sacrificial fins is recessed and replaced with an n-type material. The p-type material can be completely independent of the process for the n-type material, and vice-versa. Another embodiment may include a combination of native fins and replacement fins. Another embodiment may include replacement fins all of the same configuration. The polarity, composition, and strain of the various provisioned fins can be configured to any desired scheme, as will be appreciated.

Methodology and Architecture

FIG. 1 illustrates a method 100 for forming non-planar transistor devices by way of a shallow trench recess process that avoids trench bottom characteristics detrimental to transistor performance, in accordance with an embodiment of the present disclosure. Reference is made to FIGS. 2a-2h' for example structures resulting from the process. As can be seen, this example process employs a recess and replace technique in forming the channel material, which in turn yields structures that are distinct from structures formed from a pre-fabricated two-dimensional planar material that is patterned into fins. For instance, structures implemented in accordance with an embodiment of the present disclosure may exhibit diverse channel materials and/or configurations, which are formed in the context of a self-aligning process by virtue of the recess provided upon removal of the sacrificial fin material. The trench bottoms have non-faceted morphology and low-ion damage to provide an interface conducive to higher mobility.

Figure 2A:
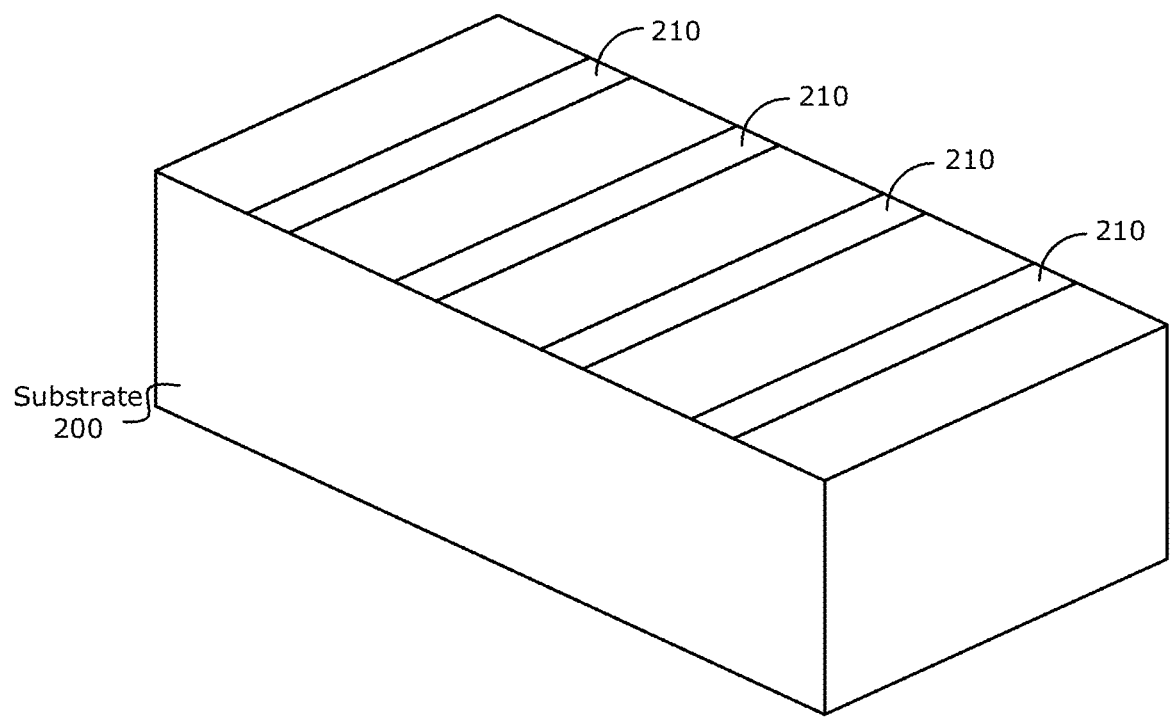
FIG. 2a illustrates a first layer patterning of fins on a semiconductor wafer, in accordance with an embodiment of the present disclosure.

The method 100 of this example embodiment commences at 102 with performing shallow trench recess (STR) patterning followed by hardmask patterning for fin formation, on a given substrate. FIG. 2a shows an example substrate 200, after this patterning, with the resulting hardmask 210. Any number of suitable substrate configurations can be used here, including bulk substrates, semiconductor-on-insulator substrates (XOI, where X is a semiconductor material such as Si, Ge or Ge-enriched Si), and multi-layered structures. In a more general sense, any substrate upon which sacrificial fins can be formed prior to a subsequent transistor formation process can be used. In one specific example case, the substrate 200 is a bulk silicon substrate.

The hardmask 210 can be provisioned on substrate 200 using any number of processes. For instance, in some embodiments, hardmask 210 can be provided using standard photolithography, including deposition of or more hardmask materials (e.g., such as silicon dioxide, silicon nitride, and/or other suitable hardmask materials), patterning resist on a portion of the hardmask that will remain temporarily to protect an underlying region of the fin (such as a diffusion or active area of a transistor device), etching to remove the unmasked (no resist) portions of the hardmask (e.g., using a dry etch, or other suitable hardmask removal process), and then stripping the patterned resist material, thereby leaving the patterned mask 210. In some such embodiments, the resulting hardmask 210 is a two-layer hardmask configured with a bottom layer of oxide (e.g., native oxide, such as silicon dioxide resulting from oxidation of silicon substrate) and top layer of silicon nitride. Any number of suitable mask configurations can be used, as will be apparent.

Figure 2B:
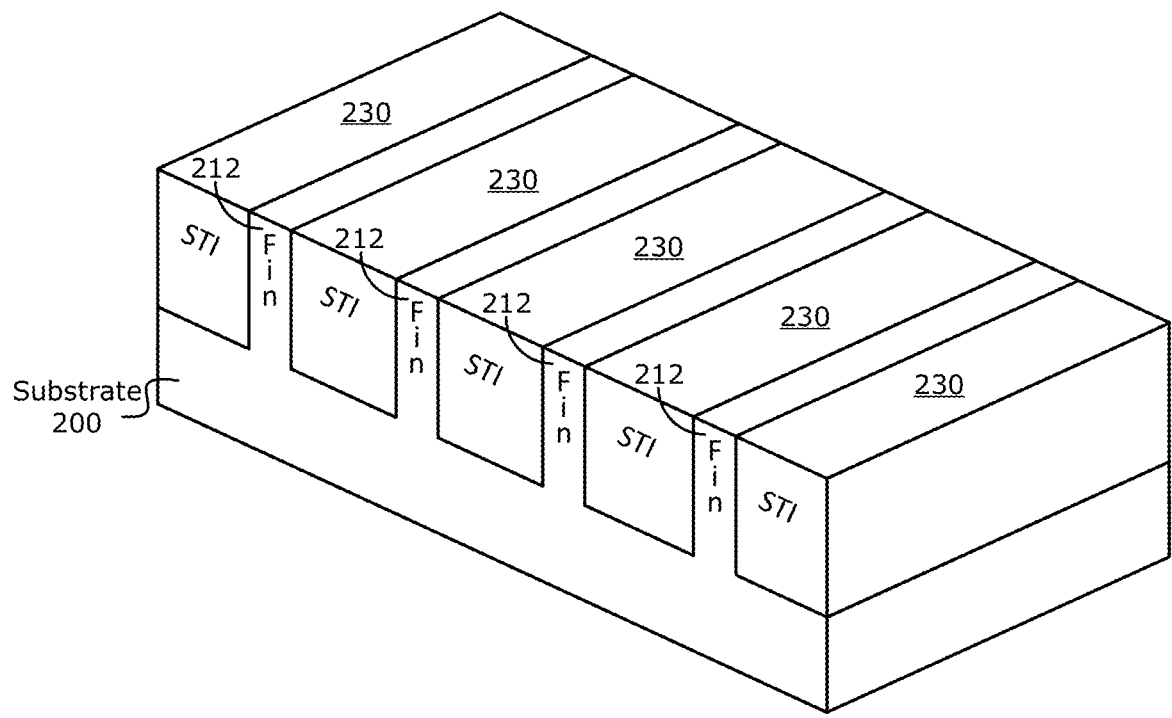
FIG. 2b illustrates the wafer of FIG. 2a after hardmask layer patterning, shallow trench recess etching, deposition of shallow trench isolation material, and planarization, in accordance with an embodiment of the present disclosure.

With further reference to FIG. 1, the method continues at 104 with performing an STR etch process to provide a plurality of fins, followed by shallow trench isolation (STI) fill and planarization of STI. FIG. 2b illustrates an example of the resulting structure. As can be seen, shallow trenches are provisioned in the substrate and subsequently filled with an insulating material so as to provide STI 230 about fins 212, in accordance with an embodiment. Any number of fins 212 can be provided, and in any desired pattern or configuration suitable for a given application. The shallow trench etch can be accomplished, for example, with standard photolithography including wet or dry etching, or a combination of etches if so desired. The geometry of the trenches (width, depth, shape, etc) can vary from one embodiment to the next as will be appreciated, and the present disclosure is not intended to be limited to any particular trench geometry. In one specific example embodiment having a bulk silicon substrate 200 and a two-layer hardmask 210 implemented with a bottom silicon dioxide ($SiO_2$) layer and a top silicon nitride layer, a dry etch is used to form the trenches that are about, for instance, 100 Å to 5000 Å below the top surface of the substrate. Any number of trench configurations can be used depending on the desired fin height, as will be apparent. The trenches can be subsequently filled using any number of suitable deposition processes. In one specific example embodiment having a silicon substrate 200, the insulating STI fill material is $SiO_2$, but any number of suitable isolation dielectric materials can be used to form the STI structures 230 here. In general, the deposited or otherwise grown isolation dielectric material for filling the trenches can be selected, for example, based on compatibility with the native oxide of the substrate 200 material. Note that the STI trenches may be circular or polygonal in nature, and any reference to trench 'sides' is intended to refer to any such configurations, and should not be interpreted to imply a particular geometric shaped structure. FIG. 2b further demonstrates how the STI insulation material can be planarized using, for example, chemical mechanical planarization (CMP) or other suitable process capable of planarizing the structure. In the example embodiment shown, the mask over the sacrificial fins is completely removed during this planarization process. Other embodiments may utilize a selective planarization configured to leave a portion of the mask in place, which can be used in subsequent processing.

While the illustrated embodiment shows fins 212 as having a width that does not vary with distance from the substrate 200, the fin 212 may be narrower at the top than the bottom in another embodiment, wider at the top than the bottom in another embodiment, or having any other width variations and degrees of uniformity (or non-uniformity). Further note that the width variation may, in some embodiments, be symmetrical or asymmetrical. Also, while the fins 212 are illustrated as all having the same width, some fins may be wider and/or otherwise shaped differently than others. For example, in an embodiment, fins to be used in the creation of NMOS transistors may be narrower than fins to be used in the creation of PMOS transistors. Other arrangements are possible, as will be appreciated. In some embodiments, for example, the fin width, which defines the width of the diffusion area of a fin-based transistor device can be less than 50 nm, or less than 40 nm, or less than 30 nm, or less than 20 nm, or less than 10 nm. In a more general sense, the fins can be patterned to have widths that are much narrower relative to, for instance, planar transistor technologies even for the same process node.

Figure 2C:
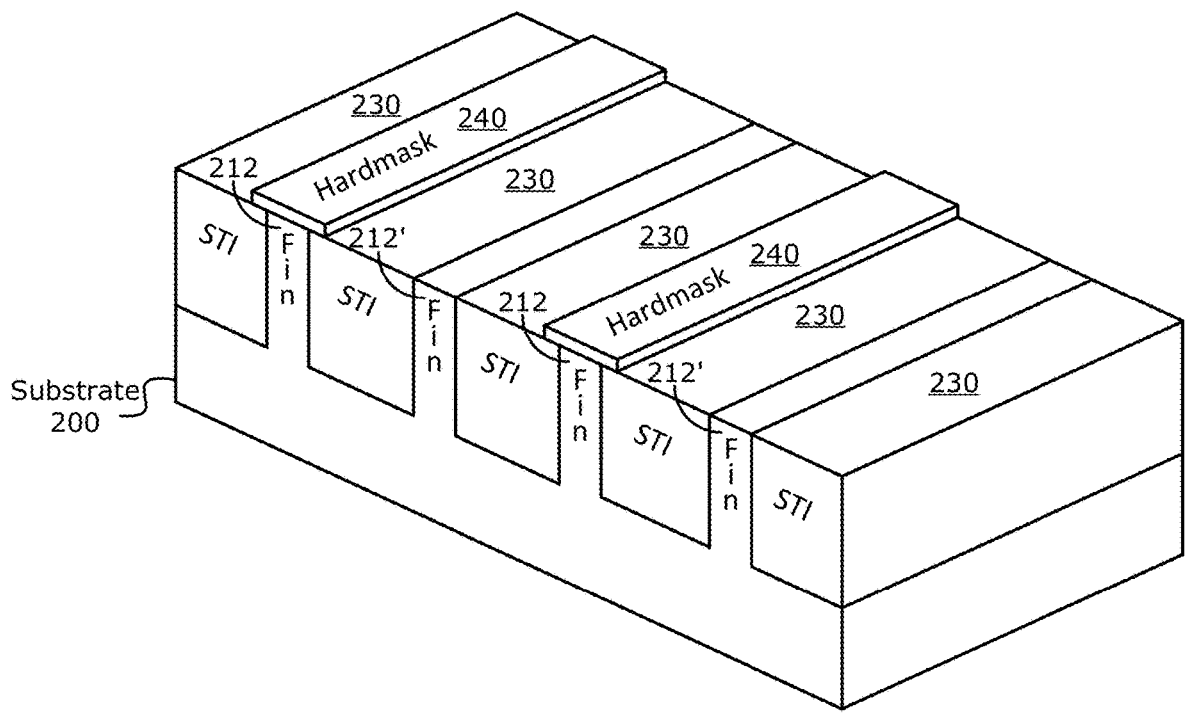
FIG. 2c illustrates the wafer of FIG. 2b after masking off a first set of fins to be replaced in applications where diverse channel materials are desired, in accordance with an embodiment of the present disclosure. As will be appreciated, no mask is needed if all fins can be replaced with the same material.

With further reference to FIG. 1, the method 100 continues at 106 with optionally patterning a hardmask to isolate a subset of fins of interest, for devices having diverse fin composition. As will be appreciated, if all the fins 212 are to be replaced with the same material, then this optional masking process can be omitted. FIG. 2c illustrates an example resulting structure wherein some of the fins are masked off with mask 240 and others are left unmasked so they can be recessed, in accordance with an embodiment of the present disclosure. In this example case, there are four fins shown, with two being masked and two unmasked, in an alternating manner (e.g., unmasked, masked, unmasked, masked). The mask 240 can be, for example, provisioned anew or left over from the STI process as previously described. In any case, the mask 240 can be any suitable material that will withstand the recess etch of the unmasked fins 212 and subsequent processing to fill those recesses (such as epitaxial processing).

Figure 2D:
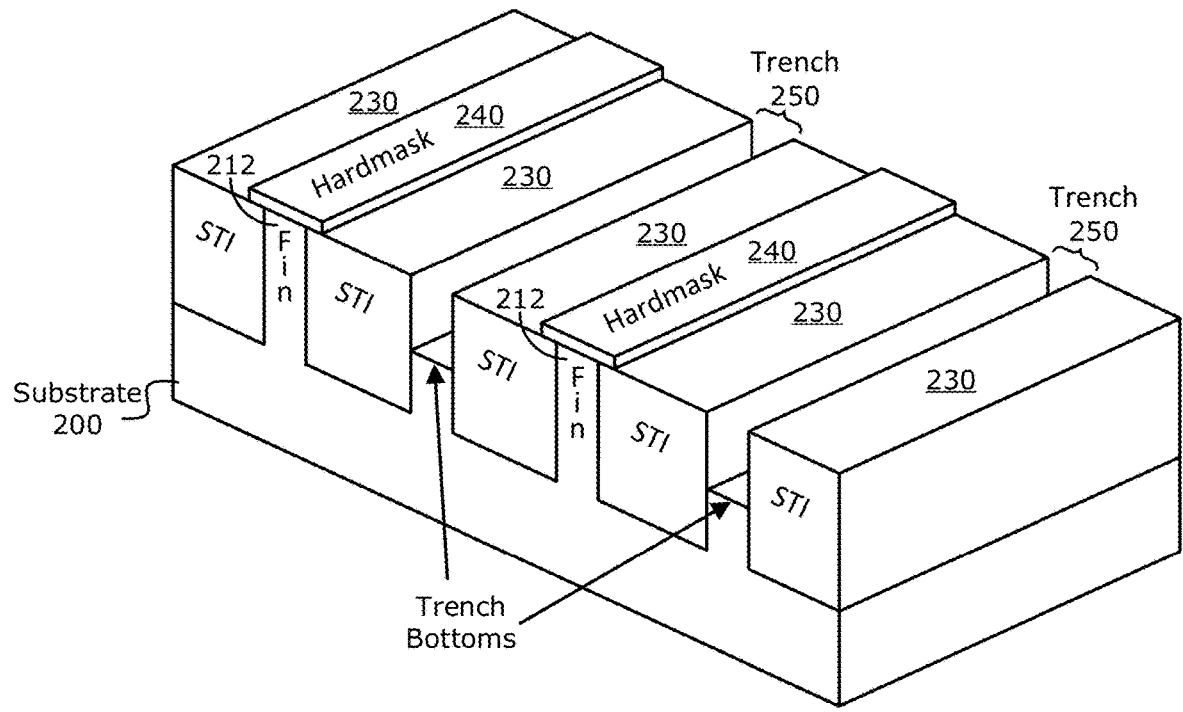
FIG. 2d illustrates the wafer of FIG. 2c after the fins have been removed by way of an etch process that avoids trench bottom characteristics detrimental to transistor performance, in accordance with an embodiment of the present disclosure.

The method continues at 108 with performing a fin removal etch that provides relatively flat trench bottoms to improve channel material interface. FIG. 2d shows an example resulting structure, according to one embodiment.

Note the recessed fins and newly formed trenches 250. As can be further seen with respect to FIG. 1, example etch schemes according to an embodiment include at least one of a low power plasma etch and a low concentration NH$_4$OH etch. Example low power plasma etches include, for instance, dry plasma etches with <3 kW, <2 kW, <1 kW, <750 W, <500 W, <250 W, <200 W, <150 W, <100 W, <50 W, <25 W, <20 W, <15 W, <10 W, <5 W, or <2.5 W power. In other embodiments, the low power etch can be measured in electron volts (eV) rather than watts, such as <100 eV, <20 eV, or <2 eV plasma power). As will be appreciated, plasma power is an equipment setting during an etch run. Equipment can vary in design and operation so the quantity of energy that is transferred in the ion/substrate collisions is only roughly conveyed in the plasma power parameter. A quantitative measure of the energy in each individual ion-substrate collision is the impact energy in units of energy, eV. Therefore, both are included herein because one is a technologically relevant term and the other is an absolute traceable measurement that can be made, for example, by placing a meter where the wafer would sit, so ion energy is comparable regardless of the design of the etch reactor. For dry etches with plasma power levels moderately above the low ion damage regime of 30 eV corresponding to 1 kW in a particular example, such as in the range of about 2 kW to 3 kW, a pulsed plasma can be used (a duty cycle of less than 100%) so as to effectively provide a more gentle plasma etch than a continuous wave (CW) plasma would provide at that same power level. Wet etches such as low concentration NH$_4$OH etches include etches with <5%, or <4%, or <3%, or <2%, or <1% NH$_4$OH. As will be appreciated in light of this disclosure, such very low etch rate and thus seemingly impractical low power dry plasma etches and low concentration NH$_4$OH wet etches can be used in a beneficial way to tune or otherwise provide trench bottom morphology that facilitates a better interface between the replacement materials to be deposited with in the trench and the substrate 200. In some cases, standard wet and/or dry etches may be used to a point so as to remove a bulk of the targeted sacrificial material, but then low power dry plasma and/or low concentration NH$_4$OH wet etches can be used to fine tune the trench bottom morphology to a non-faceted low-ion damage surface upon which the replacement fin material can be grown or otherwise deposited, so as to provide a hybrid etch scheme. Table 1 illustrates example dry etch process parameters that can be used to remove sacrificial silicon fins so as to provide trenches having non-faceted low-ion damage bottoms, according to some example embodiments.

TABLE 1

Example process parameters for dry Si etch

| Parameter | Range |
|---|---|
| Temperature (° C.) | 25 to 300 |
| Pressure (mT) | 10 to 100 |
| Flow Rate (sccm) | 1 to 60 of NF$_3$ and 50 to 1000 Ar |
| Duration (sec) | 20 to 100 |
| Power (W) | 25 to 2000 CW or up to 3000 pulsed |

As will be appreciated, continuous wave or CW is synonymous with 100% duty cycle meaning that the plasma is "on" the entire duration. The alternate to CW plasma is pulsed plasma where the power turns on and off with some frequency to make the plasma less energetic. Table 2 illustrates example wet etch process parameters that can be used to remove sacrificial silicon fins so as to provide trenches having non-faceted low-ion damage bottoms, according to some example embodiments.

TABLE 2

Example process parameters for wet Si etch

| Parameter | Range |
|---|---|
| Temperature (° C.) | 20 to 30 |
| NH$_4$OH concentration in water (%) | 1 to 5 |
| Duration (sec) | 120 to 400 |

Note that the recess etch at 108 can be a selective etch such that it will remove the unmasked fin material but none or relatively little of the STI 230 or mask 240. In such a case, note that the mask material 240 may also be implemented with the STI material (e.g., silicon dioxide, silicon nitride) or any other material resistant to the fin recess etch scheme. In one specific example embodiment, the sacrificial fins 212 are silicon and the mask 240 is silicon dioxide and/or silicon nitride, and the initial recess etch is carried out using a wet etch (e.g., potassium hydroxide or other suitable etchant that will remove the unmasked silicon fin 212 material but not the STI 230 material), followed by at least one of the low power dry plasma and low concentration NH$_4$OH wet etches to remove any faceting and ion damage so as to fine tune the bottom morphology of trenches 250. The depth of the sacrificial fin etch can vary from one embodiment to the next, and may leave a pedestal (as shown in FIG. 2d), or a recess into the substrate past the original fin bottom (effectively, the mirror image of a pedestal across the x-axis), or flush with the bottom of the STI 230 trench. As will be appreciated in light of this disclosure, the depth of the fin recess will depend on factors such as the desired channel configuration and material, substrate thickness, and/or fin height. In some embodiments, the etching process may alter the width of recesses 250, with the top of the trench 250 being wider than the bottom in some such cases. In another embodiment where the original sacrificial fin 212 was wider at the bottom than the top, the top of trench 250 may be widened to be closer to or exceed the width at the trench bottom. In yet another embodiment, the recess 250 may end up with a slightly hourglass shape, wider at the top and bottom than in the middle. In yet another embodiment, the width may be substantially unchanged by the etching process. In a more general sense, the shape of the recesses 250 may be changed by the etching process (but not necessarily so), which may in turn may change the shape of the diffusion area (or portions thereof) formed later in the method 100 at 110.

Thus, the substrate 200 can be a blank substrate that is processed to form a number of sacrificial silicon fin structures therein. However, in other embodiments, the substrate 200 can be a partially formed semiconductor structure upon which sacrificial silicon fin structures 212 are preformed. Still in other embodiments, the substrate 200 can be a partially formed semiconductor structure upon which sacrificial silicon fin structures 212 were formed and, after an STI process, were subsequently recessed or otherwise removed to provide preformed fin recesses 250. Thus, the substrate may come blank, or with preformed silicon fins 212, or with preformed silicon fins 212 and STI 230, or with preformed STI 230 and fin recesses 250. In one example embodiment, the substrate 200 comes with preformed silicon fins 212 and STI 230, wherein the top of some of the fins 212 is flush with the top surface of the STI 230, and the top of at least some of the other fins 212 is below the top surface of the STI 230 such that they are pre-recessed or otherwise fabricated to be shorter than the fins 212 flush with the STI 230. In this sense, note that the act of fin recessing to provide trenches 250 may be performed separately, so long as fins are provided having a top that is below the STI and that top is non-faceted and has low ion damage.

Figure 2E:
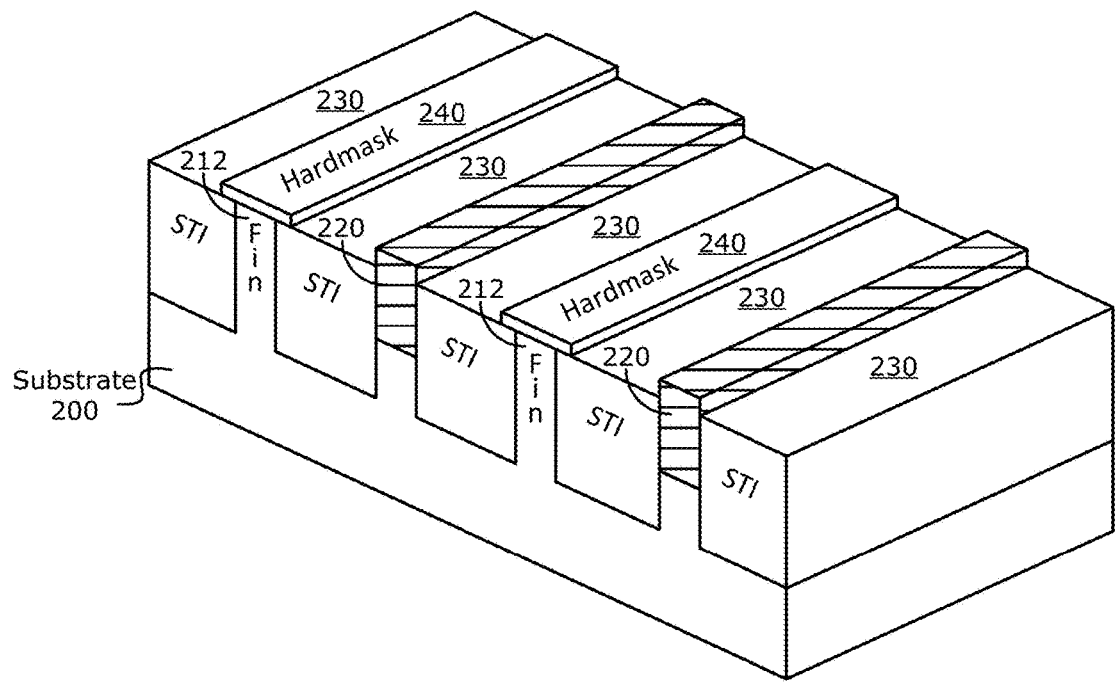
FIG. 2e illustrates the wafer of FIG. 2d after the removed fin material has been replaced with the desired replacement material, in accordance with an embodiment of the present disclosure.
Figure 2F:
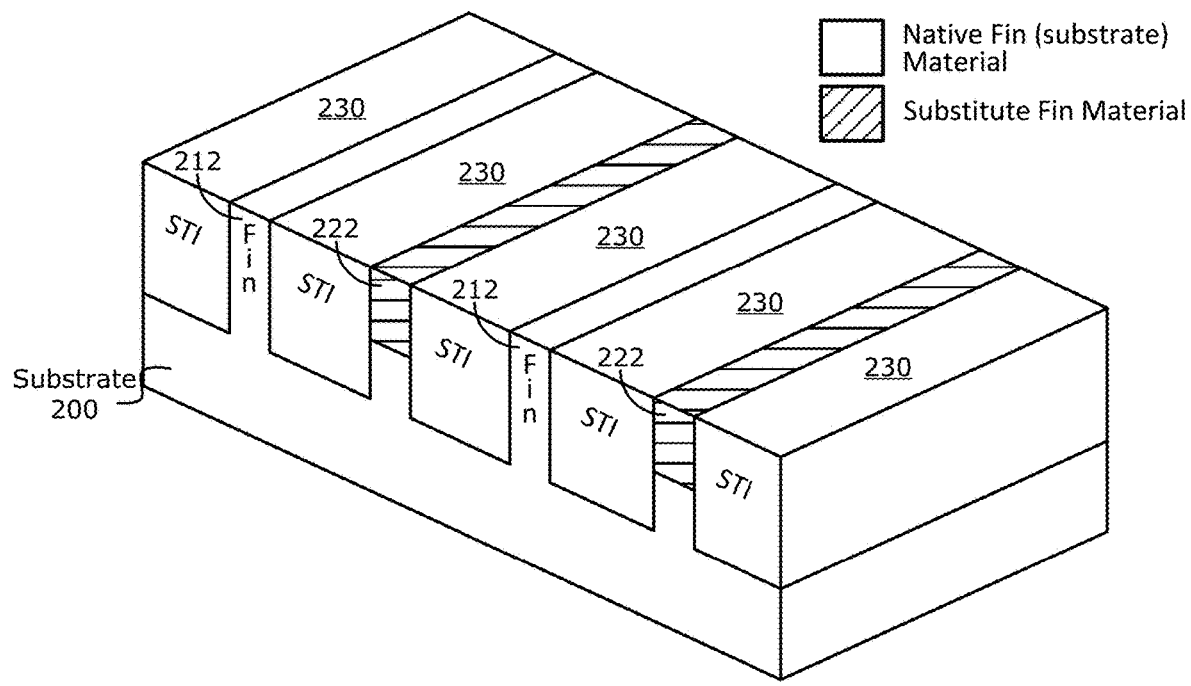
FIG. 2f illustrates the wafer of FIG. 2e after planarization to remove excess replacement material and the mask on the other fins, in accordance with an embodiment of the present disclosure.

With further reference to FIG. 1, method 100 continues at 110 with depositing channel material into the etched trenches. FIG. 2e shows an example resulting structure after deposition of channel material 220, and FIG. 2f shows the resulting structure after planarization, according to an embodiment. As can be seen in this example case, the trenches 250 have been filled by way of epitaxial growth with a particular semiconductor material, alloy or compound that appreciates a trench bottom having a non-faceted low-ion damage morphology as provided herein (e.g., silicon, germanium, SiGe, GeSn). The epitaxial material can be configured as desired with respect to any number of parameters of interest, such as layer thickness, polarity, doping, composition and/or strain. Note that the epitaxial deposition may result in some excess material that extends from the surface of STI 230 and may be misshapen, faceted and irregular. Such excess material can be removed by planarization at 110 and as further shown in FIG. 2f, so that the resulting replacement fins 220 are the same height as the STI 230. Further note that, in some embodiments, the planarization process can also be used to remove the mask 240 from the remaining sacrificial fins 212, to facilitate their subsequent processing. In some example configurations, replacement fins 222 can be, for example, an epitaxial growth of SiGe alloy of arbitrary composition, germanium, germanium-tin alloy of arbitrary composition, or any other semiconductor material, alloy or compound suitable for a given application or otherwise desired that appreciates a trench bottom having a non-faceted low-ion damage morphology as provided herein. Any suitable deposition techniques such as chemical vapor deposition (CVD), rapid thermal CVD (RT-CVD), and gas-source molecular beam epitaxy (GS-MBE) can be used to provide the replacement fin material, and numerous suitable semiconductor materials and alloys thereof can be used, as will be appreciated in light of this disclosure. In one specific embodiment, the substrate 200 is a bulk silicon substrate and the replacement fins 220 are SiGe.

With further reference to FIG. 1, recall that a second set of replacement fins different than the first set can be provided, in some embodiments. In such cases, the method 100 can repeat processing from 106 through 110 to provide the second set of replacement fins. Any number of replacement fin sets can be formed, as will be appreciated. Likewise, some of the fins may be left in their native state (silicon fins) rather than be replaced. In a more general sense, any arbitrary number of permutations of replacement fin types can be implemented with or without original fins, as will be appreciated in light of this disclosure. In one example embodiment, SiGe replacement fins are provided in the p-channel and indium gallium arsenide (InGaAs) replacement fins are provided in the n-channel. Note that the order of p and n channel processing may primarily depend, for example, on acceptable thermal budget considerations. Further recall that not all the replacement material trenches need to have a non-faceted bottom. For example, III-V material trenches may actually prefer a faceted trench bottom. Thus, the etch at 108 can be adjusted or otherwise tailored according to the replacement materials. As will be apparent in light of this disclosure, column IV materials prefer a non-faceted low-ion damage trench bottom as variously described herein. Numerous configurations providing channel diversity and relatively high channel mobility will further be apparent in light of this disclosure.

Figure 3A:
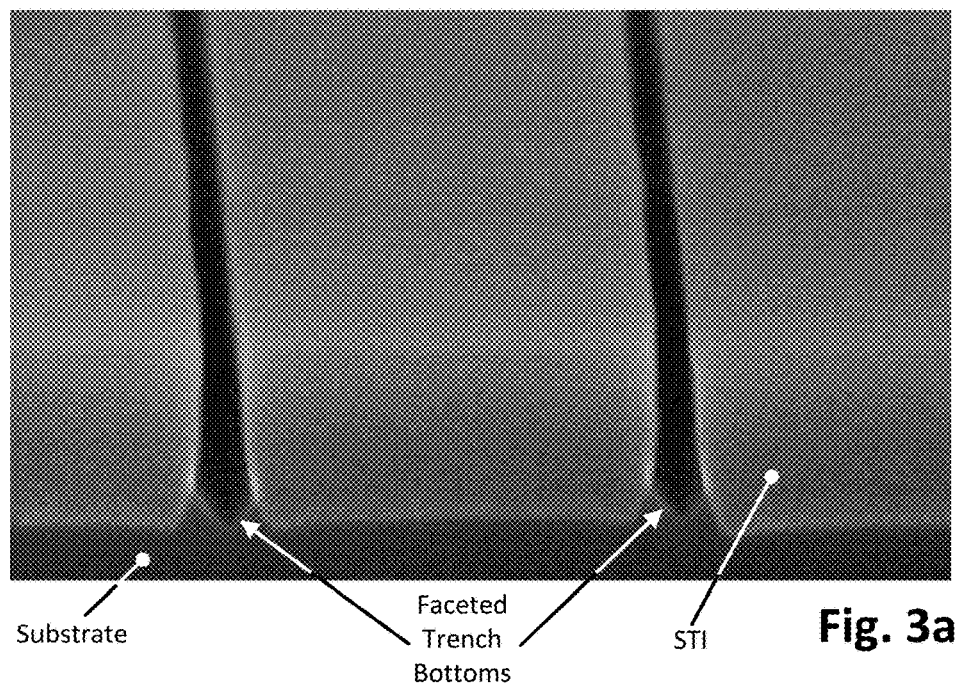
FIG. 3a illustrates an X-SEM image of replacement fins formed in a recess etched with standard wet etch processing so as to provide a faceted bottom.
Figure 3B:
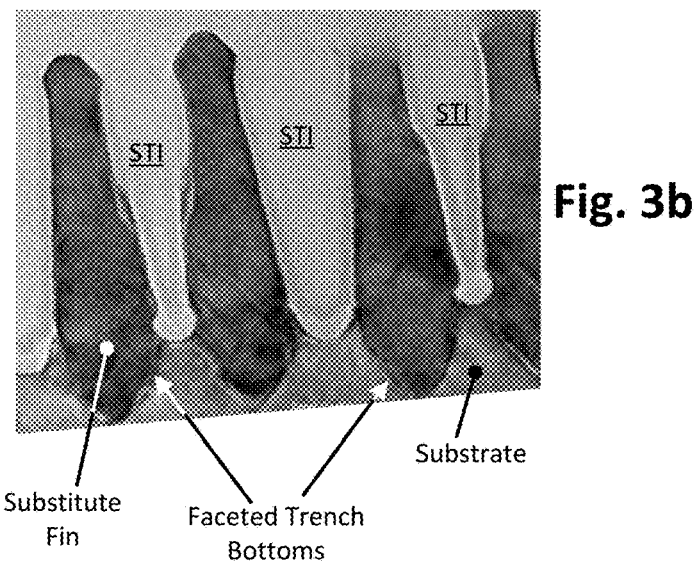
FIG. 3b illustrates an X-SEM image of replacement fins formed in a recess having a faceted bottom and defective growth of replacement material.
Figure 3C:
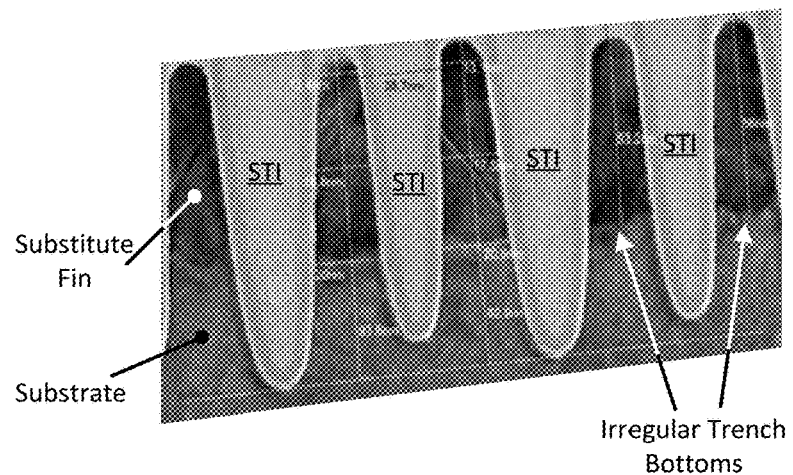
FIG. 3c illustrates an X-SEM image of replacement fins formed in a recess having an ion damaged irregular bottom defective growth of replacement material.

In any such cases, the interface between the substrate 200 and replacement fins 220 has low-ion damage and non-faceted morphology as explained herein. This is because the etch performed at 108 is configured to digest the fins 212 so as to effectively leave fin-shaped holes between the STIs 230. If the fin 212 is removed in such a manner so as to not leave any sharp <111> facets and ion damage (high point defect densities—vacancy and interstitial, as well as pockets of amorphized atoms) at the bottom of trench 250, then the epitaxial growth and hence the replacement fins 222 will have improved microstructure and device grade quality relative to trench bottoms having a faceted and/or ion damage morphology. By way of example, FIG. 3a is an X-SEM image showing faceted trench bottoms formed by typical etching schemes. Note the V-like shape of the faceted trench bottom shown in side view. FIG. 3b is an X-SEM image showing a closer view of faceted trench bottoms formed by typical wet etching schemes as well as the resulting malformed interface between the substrate and the substitute fin. In particular, note the defective SiGe growth at the faceted trench bottom surface. FIG. 3c is an X-SEM image showing a closer view of ion damaged trench bottoms formed by typical dry etching schemes as well as the resulting malformed interface between the substrate and the substitute fin. In particular, note the ion damaged trench bottom surface.

Figure 2G:
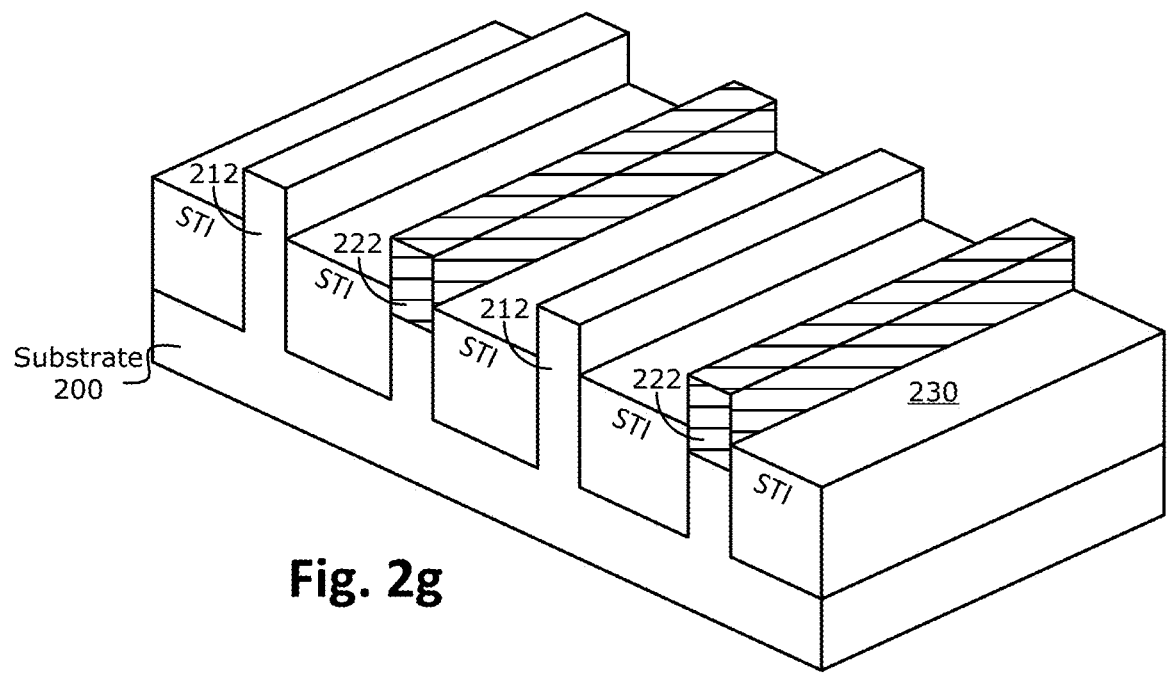
FIG. 2g illustrates the wafer of FIG. 2f after a shallow trench isolation (STI) etch to expose the fins, in accordance with an embodiment of the present disclosure.

With further reference to FIG. 1, the method continues at 112 with recessing the STI 230 to expose replacement fins as well as any native fins (if any). The method then continues at 114 with completing formation of the one or more transistors. With further reference to FIG. 2g, the STI has been recessed to expose the native fins 212 as well as the replacement fins 222. Likewise, FIG. 2g' shows an alternative embodiment where there are two sets of replacement fins, 222 and 226, where all native fins 212 have been removed. Still other embodiments may include multiple types of replacements fins as well as native fins. In any such cases, STI recess can be carried out, for example, by masking the replacement and any remaining native fins and etching the STI 230 to a suitable depth, or without a mask by using a selective etch scheme. Any suitable etch process (e.g., wet and/or dry) can be used. For instance, in one specific example embodiment, wherein the STI 230 is implemented with silicon dioxide and each of the native fins 212 is implemented with silicon and each of the replacement fins 222 is implemented with SiGe, the STI recess process is carried out using an etchant that is selective to the fin materials (doesn't etch the fin materials or otherwise etches the fin materials slower than the STI material). As will be appreciated, a mask that is impervious or otherwise suitably resistant to the STI etchant can be patterned to protect the fins, if necessary. The depth of the STI recess can vary from one embodiment to the next, and in this example embodiment is flush with the top of the remaining sacrificial fin material (or pedestal). The depth of the STI recess will depend on factors such as the desired diffusion geometry, STI thickness and desired isolation, and/or fin height. In various embodiments, this partial removal of STI 230 may alter the width of one or more of the fins (212, 222, and/or 226) with the top of the fins ending up relatively narrower than the bottom of the fins in an embodiment. In other embodiments, the widths of the fins may remain relatively unchanged. In still other embodiments, replacement fins 222 and/or 226 may have their width changed more than the native fins 212, or vice-versa.

Figure 2H:
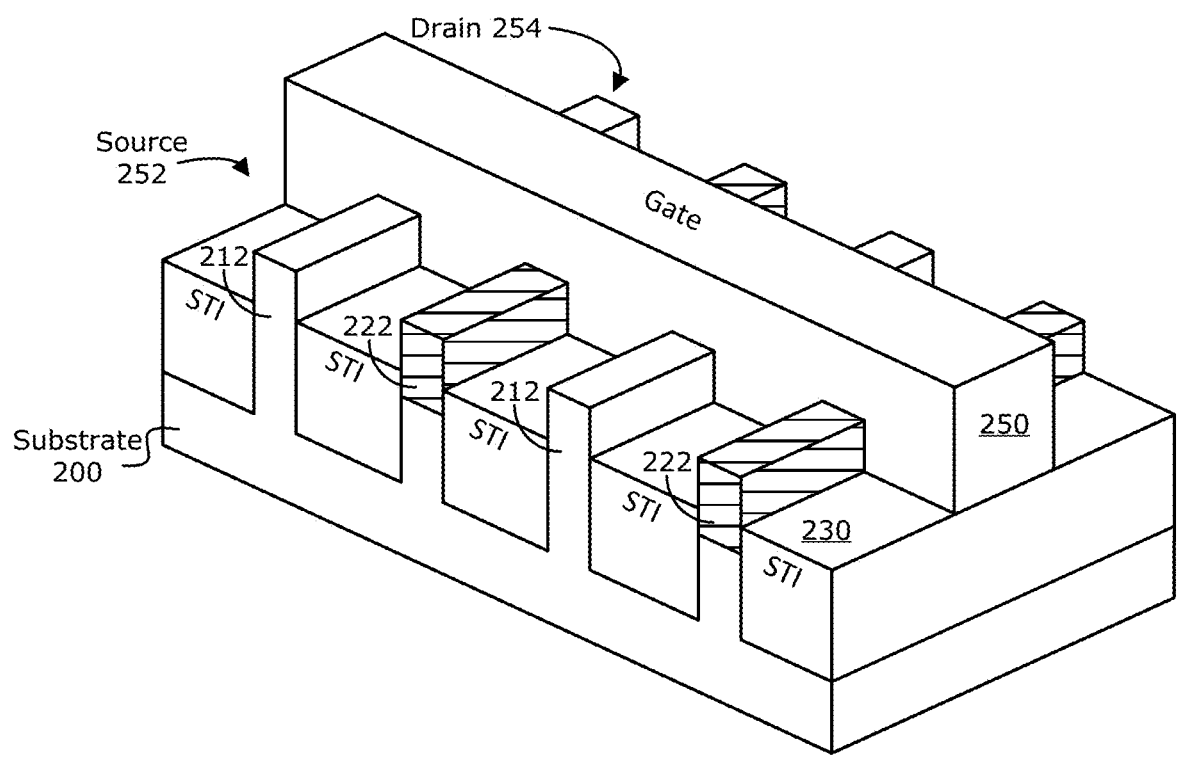
FIG. 2h illustrates the wafer of FIG. 2g after further device processing including gate stack formation and source and drain formation, in accordance with an embodiment of the present disclosure.
Figure 2G:
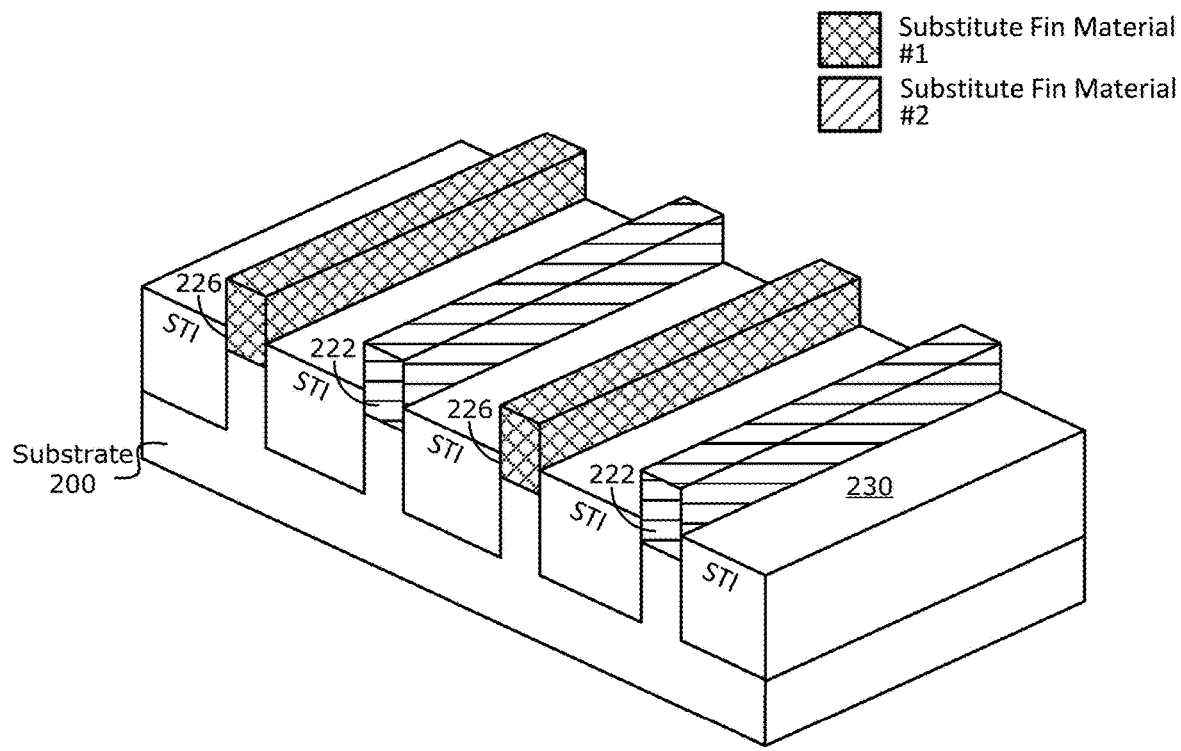
Figure 2H:
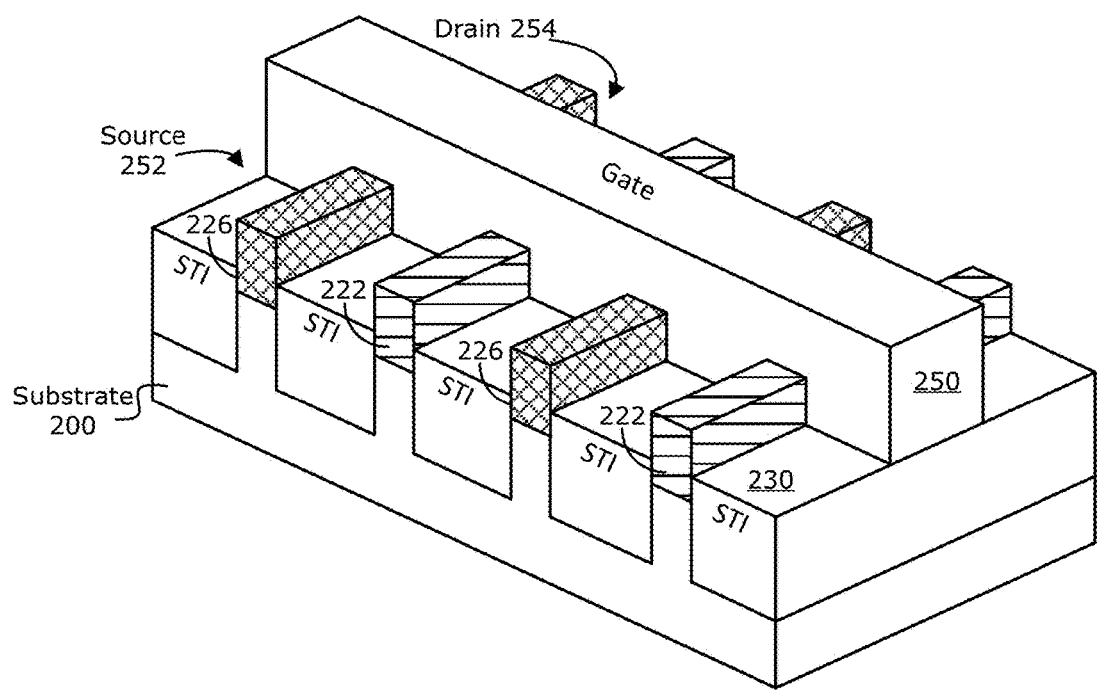

FIG. 2h shows the resulting structure after a gate stack 250 is formed, wherein a dummy gate electrode material is deposited over the fins 212 and 222, and then patterned to form a plurality of sacrificial gates, in accordance with an embodiment of the present disclosure. In a similar fashion, FIG. 2h' shows the resulting structure after a gate stack 250 is formed, wherein a dummy gate electrode material is deposited over the fins 222 and 226, and then patterned to form a plurality of sacrificial gates, in accordance with another embodiment. As will be appreciated, a dummy gate dielectric may be provisioned prior to deposition of the dummy gate electrode material. This gate dielectric is referred to as a dummy gate dielectric in the sense that it can be removed and replaced in a subsequent process in some embodiments. Note, however, that in other embodiments a gate dielectric intended for the final structure can be used. Example dummy gate dielectric materials include, for instance, silicon dioxide, and example dummy gate electrode material includes polysilicon, although any suitable dummy/sacrificial gate dielectric and/or electrode materials can be used. As will be appreciated, the dimensions of the gate materials will vary from one embodiment to the next and can be configured as desired, depending on factors such as the desired device performance attributes, device size, and gate isolation. Subsequent processing to form a completed transistor device, which may include for instance, source and drain regions, a final gate stack, and metal contacts, can be carried out as conventionally done or using any custom processing as desired. Numerous transistor configurations will be apparent in light of this disclosure, and the present disclosure is not intended to be limited to any particular one.

Gate and Source/Drain Formation

Following formation of the discrete channel regions, gate dielectric and gate electrode processing may be performed, and source and drain contacts may be added, in accordance with some example embodiments. Such post-channel processing can be carried out, for instance, as conventionally done. Other typical processing to facilitate the complete fabrication of a transistor-based integrated circuit will be apparent, such as intermediate planarization and cleaning processes, silicidation processes, contact and interconnect forming processes, and deposition-masking-etch processes. Moreover, some embodiments may employ a remove-and-replace process for forming the source/drain regions, if so desired (rather than using the as-is fin or replacement fin materials). Numerous subsequent processing schemes will be apparent in light of this disclosure.

In some example embodiments, the gate dielectric can be, for example, any suitable oxide such as $SiO_2$ or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. The gate electrode material can be, for example, polysilicon, silicon nitride, silicon carbide, or a metal layer (e.g., tungsten, titanium nitride, tantalum, tantalum nitride) although other suitable gate electrode materials can be used as well. The formed gate electrode may then be covered with a mask to protect it during subsequent processing. The gate dielectric, gate electrode and any optional mask materials can be generally referred to as a gate stack or gate structure.

Once the gate stack is fabricated, the source/drain regions can be processed. This processing may include, for example, exposing the source/drain regions by etching or otherwise removing the additional insulator material from around the fin or replacement fins, so that source drain contacts can be provisioned, which may be accomplished using a silicide process, for example. Typical source drain contact materials include, for example, tungsten, titanium, silver, gold, aluminum, and alloys thereof. As previously explained, some embodiments may employ a remove-and-replace process for forming the source/drain regions, if so desired (rather than using the as-is fin or replacement fin).

As will be appreciated, in addition the trench bottom morphology tuning etches, the depicted methodology can be carried out using any suitable standard semiconductor processes, including lithography, chemical vapor deposition (CVD), atomic layer deposition (ALD), spin-on deposition (SOD), physical vapor deposition (PVD), wet and dry etching (e.g., isotropic and/or anisotropic), depending on the materials used and desired profiles. Alternate deposition techniques may be used as well, for instance, various material layers may be thermally grown. As will be further appreciated in light of this disclosure, any number of suitable materials, layer geometries, and formation processes can be used to implement an embodiment of the present disclosure, so as to provide a custom fin-based device or structure as described herein.

Example System

Figure 6:
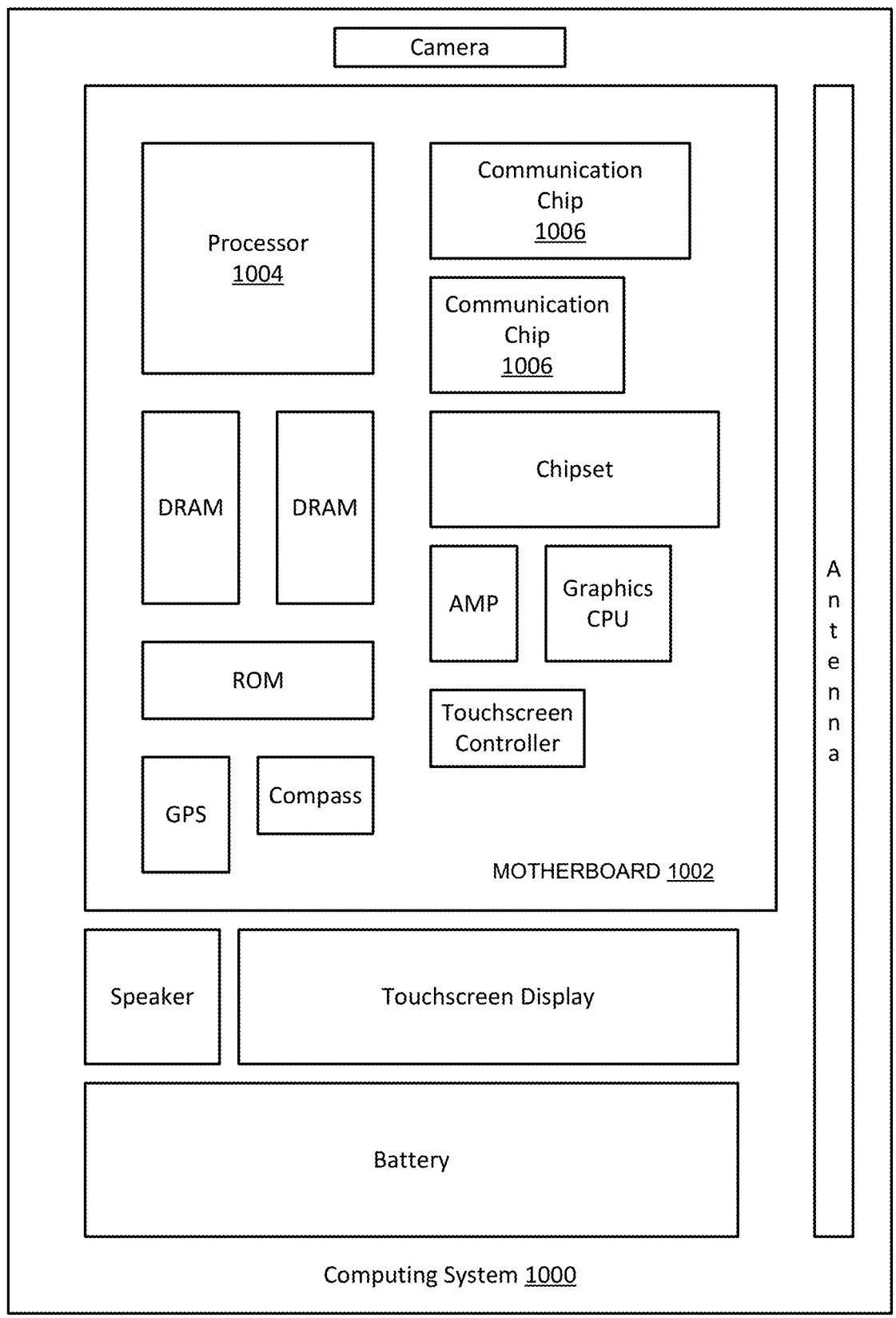
FIG. 6 illustrates a computing system implemented with one or more integrated circuit structures configured in accordance with an embodiment of the present disclosure.

FIG. 6 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with fin-based transistors having one or more replacement fins having an enhanced interface (non-faceted, low-ion damage) between the replacement material and the underlying substrate. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the integrated circuit die of the processor 1004 includes one or more fin-based transistors including a replacement fin having a non-faceted, low-ion damage interface between the replacement material and the underlying substrate. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more replacement fin-based transistors as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs fin-based transistor devices as described herein (e.g., CMOS devices having both p and n type devices configured with customized channels on the same die, and having non-faceted (when appropriate), low-ion damage interfaces between the fin replacement materials and the underlying substrate. As will be appreciated in light of this disclosure, various embodiments of the present disclosure can be used to improve performance on products fabricated at any process node (e.g., in the micron range, or sub-micron and beyond) by allowing for the use of fin-based transistors having high mobility customized and diverse channel configurations (e.g., Si, SiGe, Si/SiGe, III-V, and/or combinations thereof) on the same die.

FURTHER EXAMPLE EMBODIMENTS

The following examples pertain to further embodiments, from which numerous permutations and configurations will be apparent.

Example 1 is a method for forming a fin-based transistor structure, the method comprising: forming a plurality of silicon fins on a silicon substrate, each fin extending from the substrate; forming a shallow trench isolation on opposing sides of each fin; recessing at least some of the fins to provide a first set of trenches, using at least one of a low power plasma etch having ion energy of less than 3 kW and a low concentration ammonium hydroxide etch having an ammonia concentration of less than 5%; and forming a substitute fin of a first type in each trench of the first set of trenches, each substitute fin of the first type comprising a channel of the transistor structure. As will be appreciated, such a low power plasma etch and/or low concentration ammonium hydroxide etch can be used to provide trench bottom morphology conducive to low defect interfaces between substitute fin material and the underlying substrate. The low defect interface in turn encourages greater carrier mobility.

Example 2 includes the subject matter of Example 1, wherein recessing at least some of the fins to provide a first set of trenches comprises: masking a first set of the fins of the plurality so as to leave a first set of unmasked sacrificial fins; and recessing the first set of unmasked sacrificial fins to provide the first set of trenches.

Example 3 includes the subject matter of Example 1 or 2, the method further comprising: masking each of the substitute fins of the first type so as to leave a second set of unmasked sacrificial fins; recessing the second set of unmasked sacrificial fins to provide a second set of recesses; and forming a substitute fin of a second type in each recess of the second set of recesses.

Example 4 includes the subject matter of Example 3, wherein the substitute fins of the first type are configured differently than the substitute fins of the second type with respect to at least one of polarity, strain, and/or composition.

Example 5 includes the subject matter of Example 4, wherein the substitute fins of the first type are configured for one of PMOS or NMOS and the substitute fins of the second type are configured for the other of PMOS or NMOS.

Example 6 includes the subject matter of any of the previous Examples, wherein the substitute fins are implemented with silicon germanium (SiGe).

Example 7 includes the subject matter of Example 6, wherein each of the channels implemented with SiGe is a p-type channel.

Example 8 includes the subject matter of Example 6, wherein the trench bottom where the SiGe interfaces with the silicon substrate is flat, or curved but flatter than a semi-circle cross-section. Note that "flat" as used herein need not be perfectly flat; rather, flat is intended to also include a surface that may undulate to some degree along its length so as to provide a highest point and a lowest point, such that the difference between those points is a value somewhere between zero (perfectly flat) and about ten or so percent (or less) of the overall length of the surface (sufficiently flat). So, for example, for longer length surfaces such as 100 to 200 nm, a high-low variation of about 10 to 20 nm between the high and low points of that surface may be considered flat. Similarly, for shorter length surfaces such as 10 to 20 nm, a high-low variation of about 1 to 2 nm between the high and low points of that surface may be considered flat. Other degrees of flatness may be used, as will be appreciated in light of this disclosure.

Example 9 includes the subject matter of Example 8, wherein the interface where the SiGe interfaces with the silicon substrate has a defect density of less than 1000 stacking faults and dislocations per linear cm.

Example 10 includes the subject matter of any of the previous Examples, wherein the substitute fins interface with the silicon substrate at each trench bottom, and each interface has a non-faceted morphology and a defect density of less than 10000 defects/linear cm.

Example 11 includes the subject matter of any of the previous Examples, wherein the substitute fins interface with the silicon substrate at each trench bottom, and each interface has a non-faceted morphology and a defect density of less than 1000 defects/linear cm.

Example 12 includes the subject matter of any of the previous Examples, wherein the substitute fins interface with the silicon substrate at each trench bottom, and each interface has a non-faceted morphology and a defect density of less than 500 defects/linear cm.

Example 13 includes the subject matter of any of the previous Examples, wherein the substitute fins interface with the silicon substrate at each trench bottom, and each interface has a non-faceted morphology and a defect density of less than 100 defects/linear cm.

Example 14 includes the subject matter of any of the previous Examples, wherein the substitute fins interface with the silicon substrate at each trench bottom, and each interface has a non-faceted morphology and a defect density of less than 50 defects/linear cm.

Example 15 includes the subject matter of any of the previous Examples, wherein the substitute fins are implemented with SiGe, and the SiGe interfaces with the silicon substrate at each trench bottom, and each interface has a non-faceted morphology and a defect density of less than 10000 defects/linear cm.

Example 16 includes the subject matter of any of the previous Examples, wherein the substitute fins are implemented with SiGe, and the SiGe interfaces with the silicon substrate at each trench bottom, and each interface has a non-faceted morphology and a defect density of less than 1000 defects/linear cm.

Example 17 includes the subject matter of any of the previous Examples, wherein the substitute fins are implemented with SiGe, and the SiGe interfaces with the silicon substrate at each trench bottom, and each interface has a non-faceted morphology and a defect density of less than 500 defects/linear cm.

Example 18 includes the subject matter of any of the previous Examples, wherein the substitute fins are implemented with SiGe, and the SiGe interfaces with the silicon substrate at each trench bottom, and each interface has a non-faceted morphology and a defect density of less than 100 defects/linear cm.

Example 19 includes the subject matter of any of the previous Examples, wherein the substitute fins are implemented with SiGe, and the SiGe interfaces with the silicon substrate at each trench bottom, and each interface has a non-faceted morphology and a defect density of less than 50 defects/linear cm.

Example 20 includes the subject matter of any of the previous Examples, wherein recessing at least some of the fins to provide a first set of trenches comprises recessing all fins in the plurality.

Example 21 includes the subject matter of any of the previous Examples, and further includes: recessing shallow trench isolation on the substrate to expose sidewalls of the substitute fins of the first type; forming a gate structure over the channel of each of the substitute fins of the first type; and forming source/drain regions associated with each of the channels.

Example 22 includes the subject matter of any of the previous Examples, wherein remaining fins of the plurality are native silicon fins, each remaining fin comprising a channel of the transistor structure.

Example 23 includes the subject matter of Example 22, and further includes: recessing shallow trench isolation on the substrate to expose sidewalls of the substitute fins of the first type and the remaining fins; and forming a gate structure over the channel of each of the substitute fins of the first type and the remaining fins; and forming source/drain regions associated with each of the channels.

Example 24 includes the subject matter of any of the previous Examples, wherein recessing at least some of the fins to provide a first set of trenches comprises a low power plasma etch having ion energy of less than 2 kW.

Example 25 includes the subject matter of any of the previous Examples, wherein recessing at least some of the fins to provide a first set of trenches comprises a low power plasma etch having ion energy of less than 30 eV, or less 20 eV in still other examples.

Example 26 includes the subject matter of any of the previous Examples, wherein recessing at least some of the fins to provide a first set of trenches comprises a low concentration ammonium hydroxide etch having an ammonia concentration of less than 1%.

Example 27 is an integrated circuit formed by the method any of the previous Examples.

Example 28 is a transistor device, comprising: a first plurality of silicon germanium (SiGe) fins on a silicon substrate so as to provide a SiGe/silicon interface associated with each fin, each extending from the substrate and comprising a channel area, wherein each SiGe/silicon interface has a non-faceted morphology and a defect density of less than 10000 stacking faults and dislocations per linear cm; and a second plurality of other fins on the substrate, each fin of the second plurality extending from the substrate and comprising a channel area.

Example 29 includes the subject matter of Example 28, wherein the second plurality of other fins also includes SiGe fins.

Example 30 includes the subject matter of Example 28, wherein the other fins of the second plurality are not SiGe or native silicon fins.

Example 31 includes the subject matter of any of Examples 28, wherein the other fins of the second plurality are native silicon fins.

Example 32 includes the subject matter of any of Examples 28 through 31, wherein each SiGe/silicon interface is flat, or curved but flatter than a semi-circle cross-section.

Example 33 includes the subject matter of any of Examples 28 through 32, wherein each SiGe/silicon interface has a defect density of less than 1000 stacking faults and dislocations per linear cm.

Example 34 includes the subject matter of any of Examples 28 through 33, wherein each SiGe/silicon interface has a defect density of less than 500 stacking faults and dislocations per linear cm.

Example 35 includes the subject matter of any of Examples 28 through 34, wherein each SiGe/silicon interface has a defect density of less than 100 stacking faults and dislocations per linear cm.

Example 36 includes the subject matter of any of Examples 28 through 35, wherein each SiGe/silicon interface has a defect density of less than 50 stacking faults and dislocations per linear cm.

Example 37 includes the subject matter of any of Examples 28 through 36, and further includes: a shallow trench isolation on opposing sides of each fin of the first and second plurality of fins.

Example 38 includes the subject matter of any of Examples 28 through 37, wherein each of the SiGe fin channels is a p-type channel.

Example 39 includes the subject matter of Example 38, wherein the channel areas of the other fins are n-type channels.

Example 40 includes the subject matter of any of Examples 28 through 39, and further includes: a gate stack; and source/drain regions.

Example 41 is an integrated circuit including the device of any of Examples 28 through 40.

Example 42 is a system comprising the integrated circuit of Example 42.

Example 43 is an integrated circuit, comprising: a first plurality of substitute fins of a first type on a silicon substrate so as to provide an interface associated with each substitute fin, each substitute fin of the first plurality extending from the substrate and comprising a channel, wherein each interface has a non-faceted morphology and a defect density of less than 5000 stacking faults and dislocations per linear cm; a second plurality of other fins on the substrate, each fin of the second plurality extending from the substrate and comprising a channel; a shallow trench isolation on opposing sides of each fin of the first and second plurality of fins; a gate structure over the channel of each of the substitute fins of the first type and the other fins; and source/drain regions corresponding to each channel.

Example 44 includes the subject matter of Example 43, wherein the other fins of the second plurality are substitute fins of a second type.

Example 45 includes the subject matter of Example 43 or 44, wherein the other fins of the second plurality are substitute fins of a second type on the silicon substrate so as to provide an interface associated with each of the other substitute fins, each such interface having a faceted morphology.

Example 46 includes the subject matter of any of Example 43 through 45, wherein the first plurality of substitute fins includes silicon germanium (SiGe) fins, and the other fins of the second plurality are not SiGe or native silicon fins. In one such example case, the other fins are III-V material fins, such as indium gallium arsenide (InGaAs) or some other III-V compound.

Example 47 includes the subject matter of Example 43, wherein the other fins of the second plurality are native silicon fins.

Example 48 includes the subject matter of any of Examples 43 through 47, wherein each interface is flat, or curved but flatter than a semi-circle cross-section.

Example 49 includes the subject matter of any of Examples 43 through 48, wherein each interface has a defect density of less than 1000 stacking faults and dislocations per linear cm.

Example 50 includes the subject matter of any of Examples 43 through 49, wherein each interface has a defect density of less than 500 stacking faults and dislocations per linear cm.

Example 51 includes the subject matter of any of Examples 43 through 50, wherein each interface has a defect density of less than 100 stacking faults and dislocations per linear cm.

Example 52 includes the subject matter of any of Examples 43 through 51, wherein each interface has a defect density of less than 50 stacking faults and dislocations per linear cm.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. For instance, while the techniques are discussed primarily in the context of forming transistors such as FETs, other devices can be made as well such as diodes, variable capacitors, dynamic resistors, etc. It is intended that the scope of the present disclosure be limited not by this detailed description, but rather by the claims appended hereto.

What is claimed is:

1. A transistor device, comprising:
   a first plurality of fins comprising silicon and germanium on a substrate comprising silicon so as to provide an interface comprising germanium and/or silicon associated with each fin, wherein each interface has a non-faceted morphology and a defect density of less than 10000 stacking faults and dislocations per linear cm, wherein at least one interface is curved but flatter than a semi-circle cross-section;
   a second plurality of other fins on the substrate;
   a gate stack; and
   source regions and drain regions on opposing sides of the gate stack.

2. The device of claim 1 wherein the other fins of the second plurality include at least one of fins comprising silicon and germanium, and fins comprising silicon.

3. The device of claim 1 wherein each interface has a defect density of less than 1000 stacking faults and dislocations per linear cm.

4. The device of claim 1 wherein each interface has a defect density of less than 500 stacking faults and dislocations per linear cm.

5. The device of claim 1 further comprising:
   a first shallow trench isolation region on a first side of a first fin of the first plurality of fins; and
   a second shallow trench isolation region on a second side of the first fin,
   wherein each of the first shallow trench isolation region and the second shallow trench isolation region has a corresponding lowermost surface that is on the substrate, and
   wherein the lowermost surfaces of the first and second shallow trench isolation regions are below the interface between the first fin and the substrate.

6. An integrated circuit comprising the device of claim 1.

7. An integrated circuit, comprising:
   a first plurality of substitute fins of a first type on a substrate comprising silicon so as to provide a corresponding interface between each substitute fin and the substrate, wherein each interface has a non-faceted morphology and a defect density of less than 5000 stacking faults and dislocations per linear cm, wherein at least one interface is curved but flatter than a semi-circle cross-section;

a second plurality of other fins on the substrate;

a shallow trench isolation on opposing sides of each fin of the first and second plurality of fins;

a gate structure over at least one of the substitute fins of the first type and at least one of the other fins; and a plurality of source regions and drain regions and associated with corresponding fins of the first plurality or the second plurality, each of the source regions and drain regions on opposing sides of the gate structure.

8. The integrated circuit of claim 7 wherein the other fins of the second plurality are substitute fins of a second type on the substrate so as to provide an interface associated with each of the other substitute fins, each such interface having a faceted morphology.

9. The integrated circuit of claim 7 wherein the first plurality of substitute fins includes fins comprising silicon and germanium, and the other fins of the second plurality excludes at least one of silicon and germanium.

10. The integrated circuit of claim 7 wherein each interface has a defect density of less than 100 stacking faults and dislocations per linear cm.

11. The integrated circuit of claim 7 wherein each interface has a defect density of less than 50 stacking faults and dislocations per linear cm.

* * * * *